(12) United States Patent
Kim

(10) Patent No.: US 8,884,338 B2
(45) Date of Patent: Nov. 11, 2014

(54) SEMICONDUCTOR INTEGRATED-CIRCUIT DEVICE WITH STANDARD CELLS

(75) Inventor: Ki Joong Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 822 days.

(21) Appl. No.: 12/557,995

(22) Filed: Sep. 11, 2009

(65) Prior Publication Data

US 2010/0289069 A1    Nov. 18, 2010

(30) Foreign Application Priority Data

May 13, 2009    (KR) ........................ 10-2009-0041623

(51) Int. Cl.
| | |
|---|---|
| H01L 23/52 | (2006.01) |
| H01L 27/07 | (2006.01) |
| G11C 11/4074 | (2006.01) |
| G11C 7/02 | (2006.01) |
| G11C 5/06 | (2006.01) |
| H01L 27/105 | (2006.01) |
| H01L 29/94 | (2006.01) |
| H01L 27/02 | (2006.01) |

(52) U.S. Cl.
CPC .......... *H01L 27/105* (2013.01); *H01L 27/0733* (2013.01); *G11C 11/4074* (2013.01); *G11C 7/02* (2013.01); *H01L 27/0207* (2013.01); *G11C 5/063* (2013.01); *H01L 29/94* (2013.01)
USPC .................... 257/207; 257/202; 257/E27.108

(58) Field of Classification Search
CPC .................... H01L 27/118; H01L 2924/19041
USPC ............ 257/202, 207, 208, E27.108, 202.207
See application file for complete search history.

(56) References Cited

U.S. PATENT DOCUMENTS

| | | | | |
|---|---|---|---|---|
| 5,631,492 A | * | 5/1997 | Ramus et al. | 257/532 |
| 6,020,616 A | * | 2/2000 | Bothra et al. | 257/381 |
| 2005/0009258 A1 | | 1/2005 | Inoue et al. | |
| 2005/0116273 A1 | * | 6/2005 | Inoue et al. | 257/296 |

FOREIGN PATENT DOCUMENTS

| | | |
|---|---|---|
| JP | 2007-299860 | 11/2007 |
| KR | 1998-079436 | 11/1998 |

OTHER PUBLICATIONS

Office Action issued in corresponding Chinese Patent Application No. 200910175154.3, mailed Feb. 16, 2012.
Office Action issued in corresponding Korean Patent Application No. 10-2009-0041623, mailed Apr. 26, 2013, 4 pages.

* cited by examiner

*Primary Examiner* — Jerome Jackson, Jr.
*Assistant Examiner* — Paul Budd
(74) *Attorney, Agent, or Firm* — Brinks Gilson & Lione

(57) ABSTRACT

A semiconductor integrated-circuit device is disclosed. The semiconductor integrated-circuit device uses a filter, which includes a standard capacitor, as a standard cell connecting a memory cell with a logic cell. As such, the semiconductor integrated-circuit device can minimize a glitch phenomenon of power/ground voltages and provide stability of power/ground voltages.

8 Claims, 5 Drawing Sheets

SEMICONDUCTOR INTEGRATED-CIRCUIT DEVICE WITH STANDARD CELLS

This application claims the benefit of Korea Patent Application No. 10-2009-0041623 filed on May 13, 2009, the entire contents of which is incorporated herein by reference for all purposes as if fully set forth herein.

BACKGROUND

1. Field of the Invention

This disclosure relates to a semiconductor integrated-circuit device and more particularly to a semiconductor integrated-circuit device with standard cells, each having a standard capacitor.

2. Discussion of the Related Art

In general, large-scale logic circuits have been implemented in a gate array, a cell based integrated-circuit, and others. These integrated circuits include a plurality of unit circuits which are called "cells".

The cells are classified into a logic cell, a memory cell, and a standard cell. The logic cells each include a logic circuit which consists of at least one of NAND, NOR, AND, OR, or other types of gates. The memory cell has a predetermined configuration. That is, the memory cell may be configured or programmed in a previously desired state as flash memory. The standard cell connects the logic cells with each other or the memory cell with the logic cell. To this end, the standard cell is positioned between the logic cells or between the memory cell and the logic cell. Such cells are formed by completing a mask pattern layout.

With respect to the cells, positions of input and output terminals, a response speed, and the mask pattern layout are previously determined. These cell specifications are stored in an auxiliary memory device for an integrated-circuit design support. This auxiliary memory device for the integrated-circuit design support can enable a semiconductor integrated-circuit device with a logical function to be implemented by placing the cells on a chip and connecting the cells using wiring.

The semiconductor integrated-circuit is designed through a placement and routing process. The placement and routing process arranges a plurality of memory cells, a plurality of logic cells having a variety of logical functions, and a plurality of standard cells (called "filter cells") on a semiconductor integrated-circuit chip through a placement stage, and thereafter forms a plurality of lines through a routing stage. In this case, the standard cell performs only a single function connecting the logic circuits which perform logical operations such as AND and OR operations. In other words, the standard cell does not include any circuit element in it.

The plurality of logic cells and the plurality of memory cells are arranged on a core area of the semiconductor integrated-circuit device. When a glitch phenomenon of power/ground is caused in the core area of the semiconductor integrated-circuit device by external and internal factors, it is difficult to compensate. Also, the semiconductor integrated-circuit device is easily affected by electromagnetic interference (EMI) generated in the logic cells and the memory cells.

In order to compensate for the power/ground glitch phenomenon and the electromagnetic interference, additional compensation circuits can be included in the semiconductor integrated-circuit device. However, the additional compensation circuits may reduce the internal area of the semiconductor integrated-circuit device.

BRIEF SUMMARY

According to one general aspect of the present disclosure, a semiconductor integrated-circuit device is divided into a core region in which a plurality of cells is arranged and a peripheral region excepting the core area. The semiconductor integrated-circuit device includes: a plurality of memory cells arranged in a predetermined configuration on the core area; a plurality of logic cells arranged on the core area and configured to perform a variety of logical functions; and a plurality of standard cells arranged on a region excepting other regions of the core area, which are occupied by the memory cells and the logic cells, and between the logic cells and configured to connect the logic cells, wherein the plurality of standard cells each includes a standard capacitor.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION OF THE DRAWINGS AND THE PRESENTLY PREFERRED EMBODIMENTS

Figure 1:
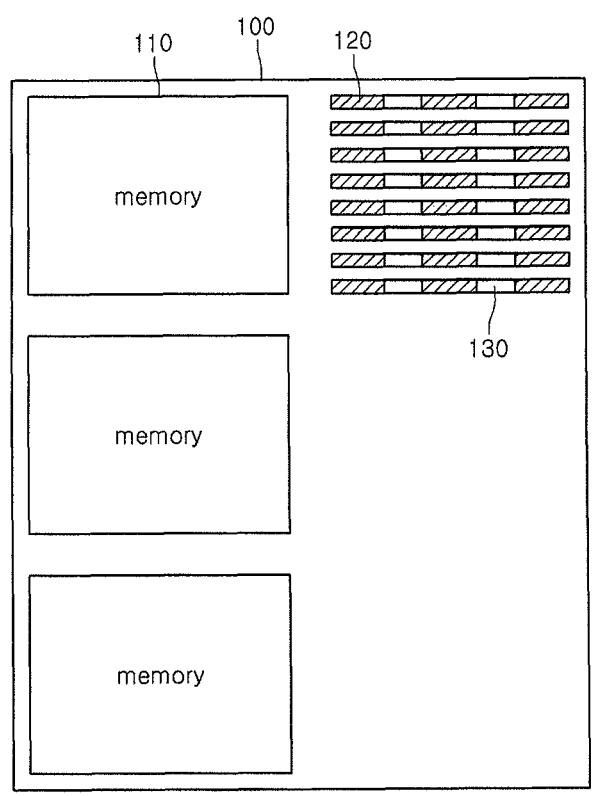
FIG. 1 is a schematic diagram showing a semiconductor integrated-circuit device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIG. 1 is a schematic diagram showing a semiconductor integrated-circuit device according to an embodiment of the present disclosure.

Referring to FIG. 1, a semiconductor integrated-circuit device according to an embodiment of the present disclosure includes a plurality of memory cells MCs 110 connected between word and bit lines, a plurality of logic cells LCs 120 performing a variety of logical functions, and a plurality of standard cells SCs 130 connecting the logic cells LCs 120. The semiconductor integrated-circuit device can further include a plurality of control terminals (not shown) receiving a plurality of control signals, a plurality of address terminals (not shown) receiving address signals, a plurality of data terminals (not shown) inputting/outputting data signals, and an interface unit (not shown) deriving internal control signals from the control, address, and data signals. The plurality of memory cells MCs 110, the plurality of logic cells LCs 120, and the plurality of standard cells SCs 130 are mainly arranged on a core region within the semiconductor integrated-circuit device.

Such a semiconductor integrated-circuit device is designed through a placement and routing process. The placement and routing process designs the plurality of memory cells MCs 110, the plurality of logic cells LCs 120, the plurality of standard cells SCs 130, and analog cells (not shown) in a placement stage, and thereafter forms a plurality of lines in a routing stage.

Figure 2:
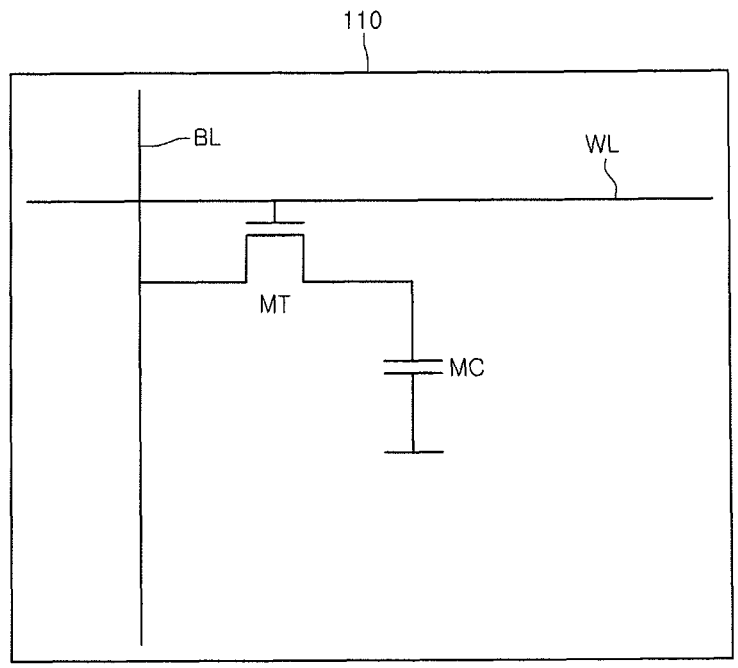
FIG. 2 is a schematic diagram showing a memory cell in FIG. 1.

The memory cells MCs 110 operate by an output of an address unit (not shown). The memory cells MCs 110 can include a memory cell transistor MT connected between a respective word line WL and a respective bit line BL, and a memory cell capacitor MC, as shown in FIG. 2. The memory cell transistor MT and the memory cell capacitor MC included in the memory cell MC 110 can be formed by an internal circuit-element placement. Such a memory cell MC 110 can be differently designed according to specifications.

Figure 3:
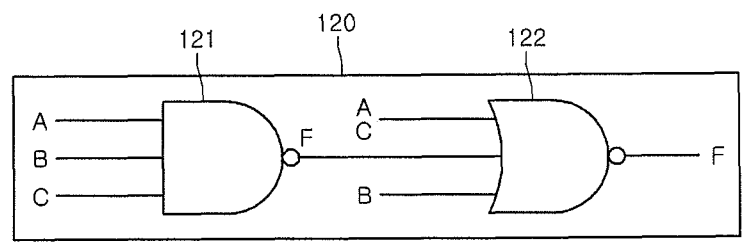
FIG. 3 is a schematic diagram showing a logic cell in FIG. 1.

The logic cell LC 120 can include a NAND gate 121 having 3 input terminals A1, B1, and C1 and a single output terminal F1, and a NOR gate 122 having 3 input terminals A2, B2, and C2 and a signal output terminal F2, as shown in FIG. 3. The NAND and NOR gates 121 and 122 included in the logic cell LC 120 are also formed by the internal circuit-element placement.

The plurality of logic cells LCs 120 are designed to include at least one logic gate having the logical functions desired by an engineer. In other words, the logic cell LC 120 can be designed with logic gates performing a variety of logical functions. For example, the logic cell LC 120 can include at least one of XOR, AND gate, OR, and other gates, as well as the NAND and NOR gates 121 and 122. Alternatively, the logic cell LC 120 can be designed to consist of the NAND and NOR gates 121 and 122, or only a single logic gate.

Figure 4:
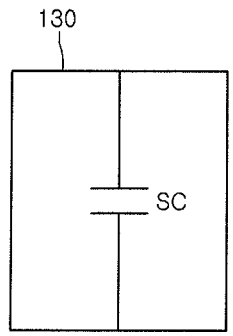
FIG. 4 is a schematic diagram showing a standard cell in FIG. 1.

The standard cells 130 are inserted into empty spaces after forming the plurality of logic cells LCs 120. As such, the standard cells 130 are positioned between the plurality of logic cells LCs and perform the function of connecting the plurality of logic cells LCs 120. Such a standard cell 130 is configured to include a standard capacitor SC, as shown in FIG. 4. The standard capacitor SC can consist of a P-MOS or N-MOS capacitor.

The empty spaces between the logic cells LCs 120 are changed from one another when the logic cells LCs 120 are placed within the semiconductor integrated-circuit device 100. As such, the standard capacitors SC having different capacities in accordance with fixed sizes can be inserted into the standard cells 130.

The standard capacitor SC can consist of an upper plate 133 including a plurality of first contact portions 135 and a lower plate 134 including a plurality of second contact portions 136. An example of the upper plate of the standard capacitor SC can become a doped CVD (Chemical Vapor Deposition) poly-silicon film. A gate dielectric layer (not shown) can be interposed between the upper and lower plates 133 and 134.

The standard capacitor SC is generally formed by performing a well ion implantation on a semiconductor substrate, thinly depositing an insulation film on the entire surface of the semiconductor substrate after the well ion implantation, then depositing a conductive film to be used for a gate electrode on the insulation film, and performing a photo process after depositing a mask film on the conductive film.

Figure 5:
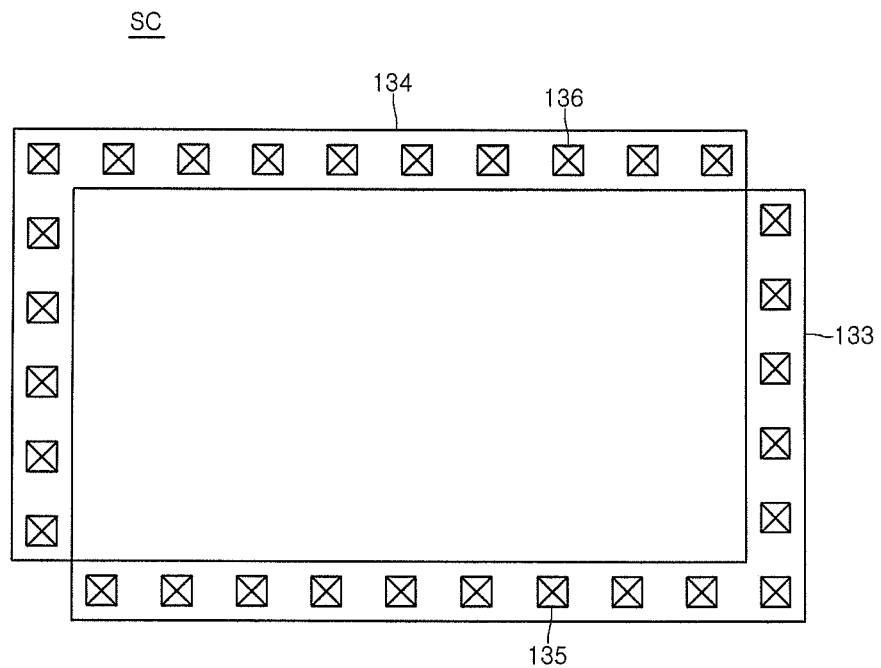
FIG. 5 is a schematic diagram showing a standard capacitor in FIG. 1.
Figure 6:
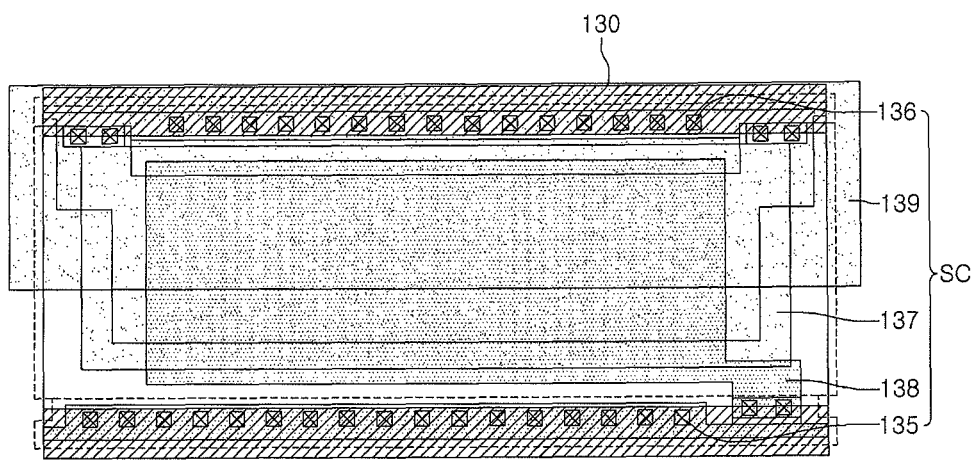
FIG. 6 is a detailed diagram showing a standard cell with the standard capacitor of FIG. 5.

FIG. 6 is a detailed diagram showing a standard cell with the standard capacitor of FIG. 5.

Referring to FIGS. 5 and 6, the standard cell 130 includes a plurality of first contact portions 135, a plurality of second portions 136, a conductive layer 137, a poly silicon layer 138, and an N-well layer 139 within a rectangular space.

As described above, the standard cells 130 is positioned between the plurality of logic cells LCs (120 in FIG. 1) and have a function connecting the logic cells LCs 120. The N-well layer 139 of the standard cell 130 is connected to an N-well layer (not shown) of the logic cell LC 120. Therefore, the logic cells LCs 120 positioned in the center of the standard cell 130 can be connected to each other.

In this way, since the standard cells 130 each having the standard capacitor SC are inserted into the empty spaces between the plurality of logic cells LCs 120, a power/ground glitch phenomenon being generated in the core area on which the logic cells LCs 120 and the memory cells MCs (120 in FIG. 1) are positioned can be prevented.

In other words, although a distortion of power/ground voltages is caused within the core area of a semiconductor integrated-circuit device by an external or internal factor, it is minimized by the charging/discharging operation of the standard capacitor in the standard cell 130. Accordingly, the semiconductor integrated-circuit device can maintain stable power/ground voltages and furthermore improve its reliability.

Moreover, an electromagnetic interference phenomenon being generative in the core area of the semiconductor integrated-circuit device can be minimized by the standard cells which occupy about 10~30% of the empty space in the semiconductor integrated-circuit device.

Consequently, the standard cells 130 each having the standard capacitor SC prevent the glitch phenomenon of the power/ground voltage from generating in the inside of the semiconductor integrated-circuit device, as well as connect the plurality of logic cells LCs 120.

As shown in FIG. 1, the plurality of memory cells MCs (110 in FIG. 1), the plurality of logic cells LCs (120 in FIG. 1), and the plurality of standard cells 130 are placed within the semiconductor integrated-circuit device. Thereafter, voltage lines receiving power and ground voltages, signal lines applying other voltages and signals to circuit elements of the semiconductor integrated-circuit device, and a plurality of word and bit lines can be formed in the mask stage.

Figure 7:
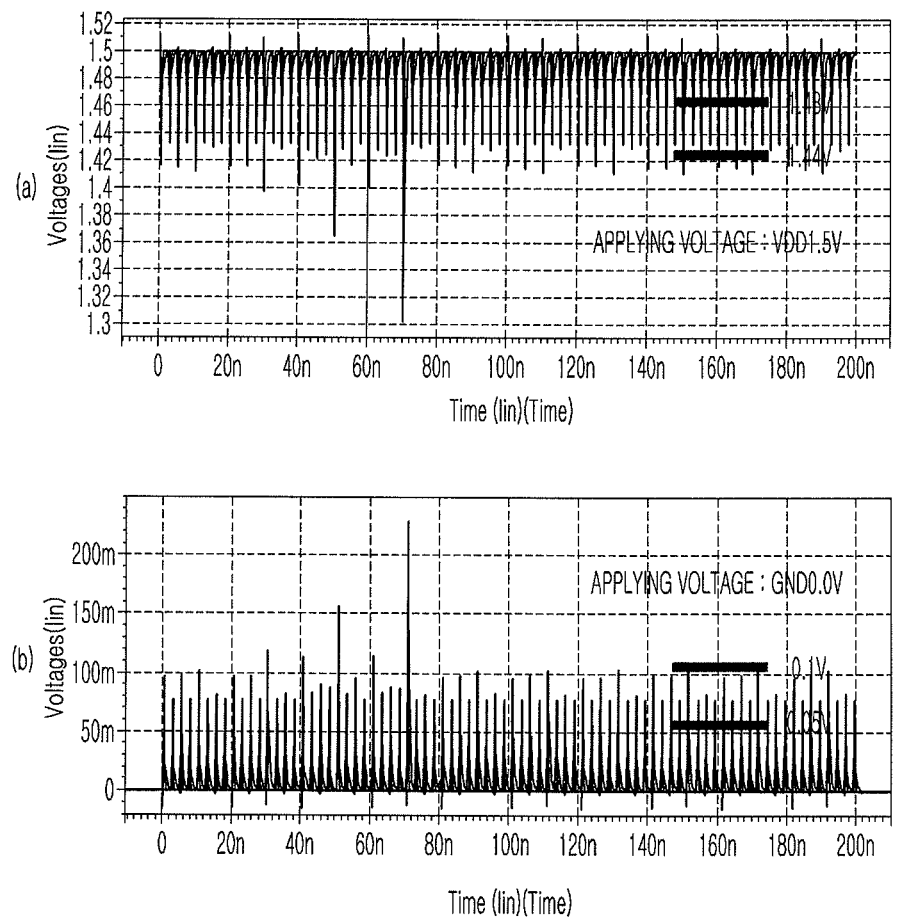
FIG. 7A illustrates empirical data showing states where power supply voltages VDD are applied to a semiconductor integrated-circuit device including a standard cell of the present embodiment and another semiconductor integrated-circuit device including a standard cell of the related art.
FIG. 7B illustrates empirical data showing states where ground voltages are applied to a semiconductor integrated-circuit device including a standard cell of the present embodiment and another semiconductor integrated-circuit device including a standard cell of the related art.

FIG. 7A illustrates empirical data showing states where power supply voltages VDD are applied to a semiconductor integrated-circuit device including a standard cell of the present embodiment and another semiconductor integrated-circuit device including a standard cell of the related art. FIG. 7B illustrates empirical data showing states where ground voltages are applied to a semiconductor integrated-circuit device including a standard cell of the present embodiment and another semiconductor integrated-circuit device including a standard cell of the related art.

As seen in FIG. 7A, when a power voltage of 1.5V is applied to a semiconductor integrated-circuit device including standard cells (130 in FIG. 6) according to an embodiment of the present disclosure, it causes a voltage drop, where the power voltage drops from 1.5V to 1.48V, by the internal factor of the semiconductor integrated-circuit device. On the other hand, if the power voltage of 1.5V is applied to a semiconductor integrated-circuit device of the related art without the standard cells, it causes a serious voltage drop where the power voltage drops from 1.5V to 1.44V by the internal factor of the related art semiconductor integrated-circuit device.

Similarly, when a ground voltage of 0.00V is applied from to a semiconductor integrated-circuit device including standard cells (130 in FIG. 6) according to an embodiment of the present disclosure, the ground voltage is varied from 0.00V to 0.05V by the internal factor of the semiconductor integrated-circuit device. Meanwhile, if the ground voltage of 0.00V is applied to a semiconductor integrated-circuit device of the related art without the standard cells, the ground voltage is largely varied from 0.00V to 0.10V by the internal factor of the related art semiconductor integrated-circuit device.

In this manner, the standard cell 130 with the standard capacitor SC included into the semiconductor integrated-circuit device can provide stability of the power supply and ground voltages.

Moreover, the standard capacitor SC included in a standard cell of the related art which is positioned in an empty space for the connection of the logic cells allows additional compensation circuits preventing a glitch phenomenon of the power/ground voltage and an electromagnetic interference phenomenon within the semiconductor integrated-circuit device to be eliminated. Therefore, the semiconductor integrated-circuit device according to an embodiment of the present disclosure can obtain a sufficient margin.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

The invention claimed is:

1. A semiconductor integrated-circuit device divided into a core region in which a plurality of cells is arranged and a peripheral region that does not include the core region, the device comprising:
   a plurality of memory cells arranged in a predetermined configuration on the core region;
   a plurality of logic cells arranged on the core region and configured to perform a variety of logical functions; and
   a plurality of standard cells arranged on a region excepting other regions of the core region, which are occupied by the memory cells and the logic cells, and between the logic cells and configured to connect the logic cells;
   wherein the plurality of standard cells each includes a single standard capacitor,
   wherein each respective single standard capacitor comprises an upper plate including a plurality of first contact portions and a lower plate including a plurality of second contact portions, and a gate dielectric layer interposed between the upper and lower plates; and
   wherein each respective single standard capacitor is configured to connect to adjacent logic cells through a well layer doped with a corresponding n or p type dopant.

2. The semiconductor integrated-circuit device claimed as claim 1, wherein the single standard capacitor includes one of a P-MOS and an N-MOS capacitor.

3. The semiconductor integrated-circuit device claimed as claim 1, wherein the standard cells occupy about 10%~30% of an empty space in the semiconductor integrated-circuit device.

4. The semiconductor integrated-circuit device claimed as claim 1, wherein the single standard capacitors have different capacities according to a distance between the logic cells which are positioned in the center of the respective standard cell.

5. The semiconductor integrated-circuit device claimed as claim 1, wherein the memory cells include a memory transistor connected between a respective word line and a respective bit line, and a memory cell capacitor.

6. The semiconductor integrated-circuit device claimed as claim 1, wherein the logic cells consists of only a single logic gate.

7. The semiconductor integrated-circuit device claimed as claim 1, wherein the standard cells are inserted into empty spaces after forming the plurality of logic cells.

8. The semiconductor integrated-circuit device claimed as claim 1, wherein the upper plate of the single standard capacitor is a doped CVD (Chemical Vapor Deposition) poly-silicon film.

* * * * *